United States Patent [19]
Golbach

[11] Patent Number: 5,812,377
[45] Date of Patent: Sep. 22, 1998

[54] UNIVERSAL CARD CAGE ASSEMBLY

[75] Inventor: Robert H. Golbach, Litchfield Park, Ariz.

[73] Assignee: Honeywell Inc., Minneapolis, Minn.

[21] Appl. No.: 667,036

[22] Filed: Jun. 19, 1996

[51] Int. Cl.$^6$ ...................................................... H05K 5/00
[52] U.S. Cl. .......................... 361/759; 361/752; 361/754; 361/756; 361/796; 361/801; 361/802; 211/41.17; 439/377
[58] Field of Search ..................................... 361/724–728, 361/736, 740, 741, 747, 748, 752, 756, 759, 784, 796, 797, 683, 684, 685, 686, 801, 802, 825, 829; 312/223.1, 223.6; 211/41.17, 26.2; 438/61, 64, 69, 377, 378, 354

[56] References Cited

U.S. PATENT DOCUMENTS 4,327,835 5/1982 Leger ......................................... 211/41
4,758,928 7/1988 Wierec et al. ........................... 361/801

*Primary Examiner*—Leo P. Picard
*Assistant Examiner*—Phuong T. Vu
*Attorney, Agent, or Firm*—Anthony Miologos; Arthur A. Sapelli

[57] ABSTRACT

A card cage assembly (CCA) houses printed wire boards (PWB) by a securing mechanism which attaches to the PWB, and is one of a plurality of different types. The CCA has a rectangular, box-like configuration, which comprises a top plate, bottom plate, and a first or second side plate for providing tracks. Each track provides a front-to-back path for an edge of the PWB. Further, each side plate has a mounting plate perpendicular to the surface of the side plate along an edge of the side plate which forms a periphery of an opening of the CCA. Each mounting plate also includes a plurality of fastener receivers corresponding to each track of the side plate, and spaced apart such that a PWB having a face plate with an attaching screw mates with a corresponding fastener receiver. Further, each end plate includes a plurality of cutouts in the surface of the end plate at the start of each track, such that a PWB having swivel-type injector/ejector handles mate with a corresponding cutout, thereby securing the PWB with either type securing mechanism in the CCA.

6 Claims, 4 Drawing Sheets

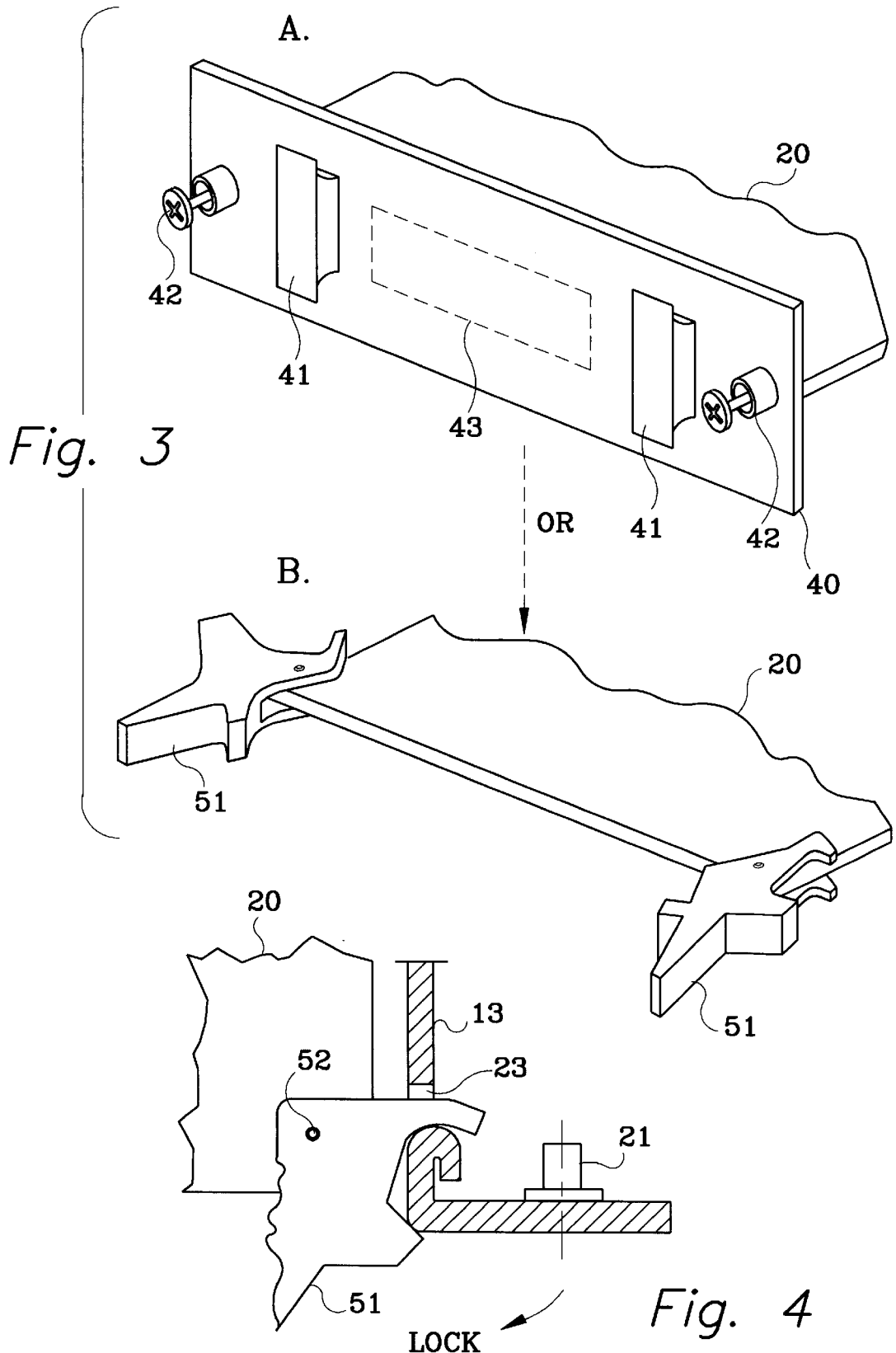

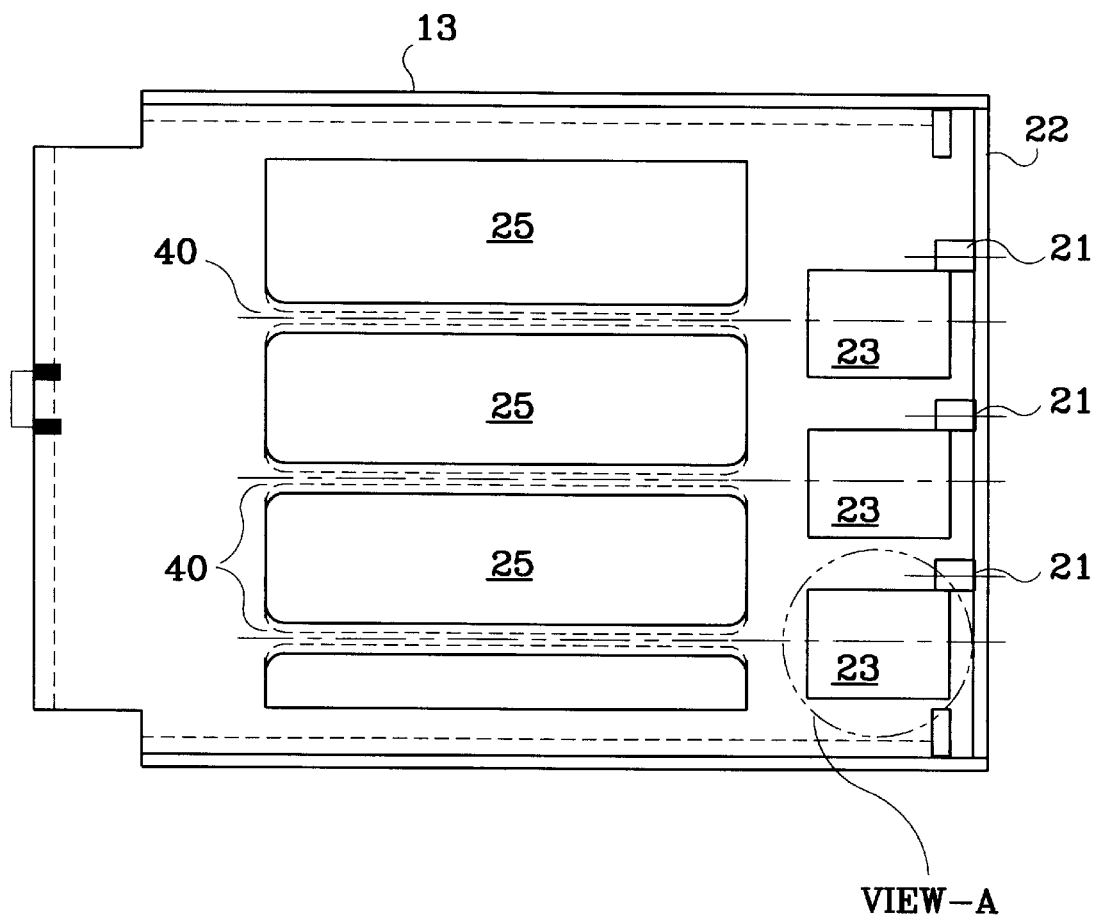
Fig. 5
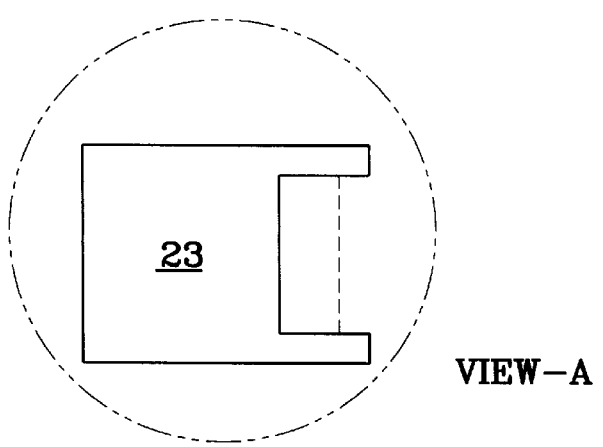
VIEW-A

UNIVERSAL CARD CAGE ASSEMBLY

BACKGROUND OF INVENTION

The present invention relates to a cage assembly, and more particularly, to a cage assembly for mounting printed wire assemblies (PWA), sometimes referred to as printed wire cards or more simply, cards, wherein the cards have a plurality of locking mechanisms for seating and holding the card in a predetermined slot of the cage assembly.

The cages are generally combined to form racks or sub-racks, each cage holding at least one printed wire assembly (also sometimes referred to as printed wire board, PWB, or more simply, board). The boards can be mounted using a "swivel" injector/ejector system or can be mounted using a VME/Eurocard standard. A PWA having one system of locking (or mounting) cannot be used in a card cage utilizing the other system of mounting. Thus, the cards are not interchangeable between the two types of card cages.

The present invention provides a novel configuration of a card cage assembly which will permit a card having either mounting system to be inserted and seated in the card cage of the present invention.

SUMMARY OF THE INVENTION

Therefore, there is provided by the present invention a universal card cage assembly. A card cage assembly (CCA) of the present invention houses printed wire boards (PWB), each PWB being held in the CCA by a securing mechanism. The securing mechanism is attached to the PWB, and is one of the plurality of different types. The CCA has a rectangular, box-like configuration, which comprises a top plate, a bottom plate, and a first or second side plate for providing tracks which permit the insertion of the PWB in predetermined slot locations within the interior of the CCA. Each track provides a front-to-back path for an edge of the PWB. Further, each side plate has a mounting plate perpendicular to the surface of the side plate along an edge of the side plate which forms a periphery of an opening of the CCA whereby the PWB is inserted. Each mounting plate also includes a plurality of fastener receivers corresponding to each track of the side plate, and spaced apart such that a PWB having a face plate with an attaching screw at each end of the face plate mates with a corresponding fastener receiver. Further, each end plate includes a plurality of cutouts in the surface of the end plate at the start of each track, such that a PWB having swivel-type injector/ejector handles (or more simply, ejector handles) mate with a corresponding cutout, thereby securing the PWB with either type securing mechanism in the CCA.

Accordingly, it is an object of the present invention to provide a universal card cage assembly.

It is another object of the present invention to provide a universal card cage assembly whereby a card having a first or second mounting assembly can be mounted in the universal card cage of the present invention.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 3, which comprises FIGS. 3A and 3B, shows a first and second method for mounting the board 20 in the card cage assembly 10;

FIG. 4 shows the ejector handles being utilized in the insertion process of board 20 into the card cage assembly 10; and FIG. 5 shows a left side view of the card cage assembly 10.

DETAILED DESCRIPTION

Figure 1:
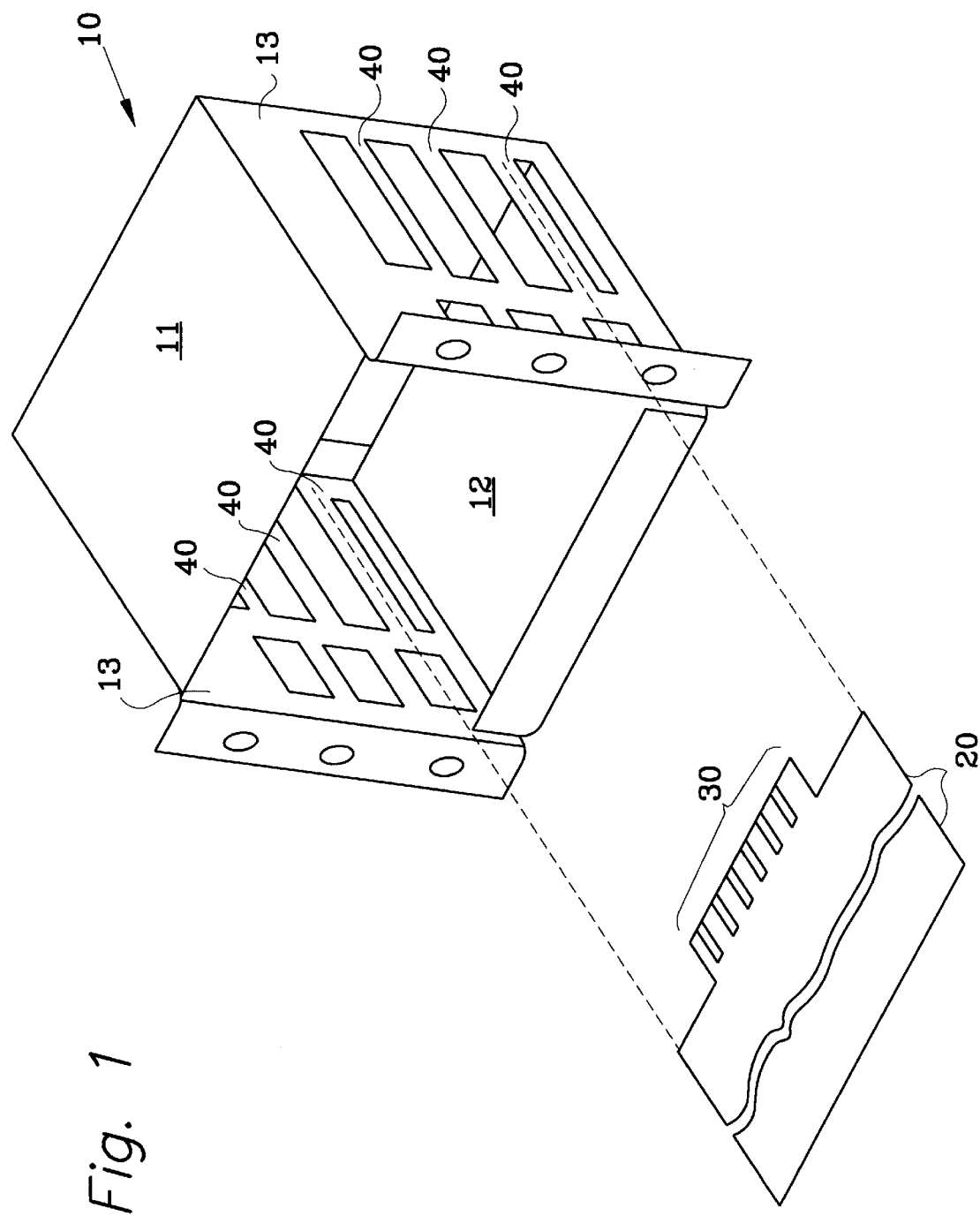
FIG. 1 shows an isometric view of a card cage assembly.

Referring to FIG. 1, there is shown an isometric view of a card cage assembly 10. The card cage assembly 10 (or more simply, card cage), for illustrative purposes, shows a card cage for mounting three (3) print circuit boards (PCB) 20 (or more simply, boards). The card cage assembly (CCA) 10 includes a top plate 11, a bottom plate 12, and two guide plates 13.

The PCB 20 in FIG. 1 is shown being inserted in the CCA 10 in a bottom-most slot of the CCA 10. Although the CCA 10 is shown accepting the boards horizontally, it will be understood by those skilled in the art that the CCA 10 can be rotated to accept the boards vertically, in which case, the top plate 11 and the bottom plate 12 are sometimes referred to as end plates. Further, the CCA 10 can be rotated in any other desired orientation. The CCA 10 is shown without a back panel for illustrative purposes only. Likewise, connectors of the board 20, which would normally mate with the back panel connectors, are also not shown. Sometimes the board may include connecting pads 30, as shown in FIG. 3, which can mate with the back panel connectors (not shown). The guide plate (or sometimes referred to herein as side plate) 13 includes tracks 40, which allow the boards 20 to slide into the CCA 10 in a predetermined location within the CCA 10, and are formed by bending the sheet metal in a manner well known to whose skilled in the art.

Figure 2:
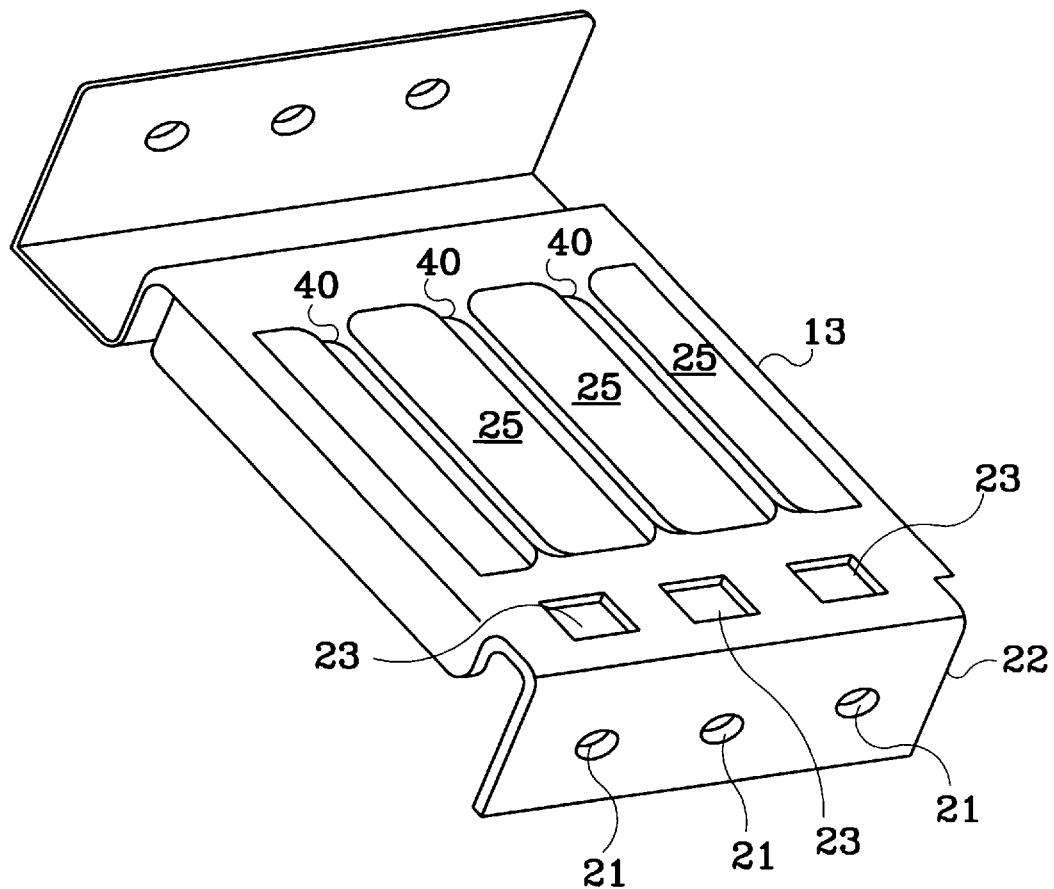
FIG. 2 shows a more-detailed drawing of the guide plate 13.

Referring to FIG. 2, there is shown a more-detailed drawing of the guide plate 13. The tracks 40 are shown formed from bending the sheet metal of the card cage assembly 10. As an alternative, the card cage 10 can include guides, generally made of a plastic material, to form the tracks in a manner well known to those skilled in the art. The open slots 25 of the guide plate 13 provide ventilation. The slots 25 may be eliminated or reduced in size if RF shielding is required, again in a manner well known to those skilled in the art. A mounting bar or mounting plate 22 of the guide plate 13 is formed by bending the sheet metal of the guide plate 13 perpendicular to the tracks of the guide plate 13. The mounting plate 22 includes a threaded fastener to receive a screw such that the screw can be held to the mounting plate 22. There is a threaded fastener 21 for each track of the guide plate 13, each track being utilized for a predetermined board. Thus, in this example, where the CCA 10 is made for three boards 20, there are six threaded fasteners 21. Within the surface of the guide plate 13, at the beginning of each track there is included a cutout 23 to receive a swivel-type locking mechanism for inserting a board 20 having a swivel-type ejector handle. This will be explained in further detail hereinunder.

Referring to FIG. 3, which comprises FIGS. 3A and 3B, there is shown a first and second method for mounting the board 20 in the card cage assembly 10. FIG. 3A includes a board 20, which has a face plate 40 mounted to the edge of the board 20. The face plate can also serve to seal off the front of the CCA 10 for RF shielding purposes. The face plate 40 includes handles 41 for inserting or removing the board 20 from the CCA 10. Once the board 20 is inserted into the correct position in the CCA 10, the two screws 42 are tightened into the threaded fasteners 21 on the mounting plate 22 of the card cage assembly 10. This serves to hold the board 20 in its inserted place. The face plate 40 may also include various openings 43 for permitting connectors, switches, pilot lights, . . . mounted on the board to be accessible external to the card cage assembly 10. These openings 43 can take any configuration desired or required to provide the access to these components mounted on the printed circuit board 20.

FIG. 3B shows a printed circuit board 20 having ejector handles 51, which are used to seat and lock the card 20 into the card cage assembly 10.

FIG. 4 shows the ejector handles (or swivel handles, since the swivel handles 51 rotate about a pin 52, which also serves to mount the swivel handle to the board 20) being utilized in the insertion process of the board 20 into the card cage assembly 10. More specifically, the ejector handle is positioned so that the card can be inserted freely (the ejector handle is rotated counterclockwise) and once the card is in place within the CCA 10, the ejector handle 51 can be rotated clockwise (for the ejector handle on the right side of the board, the rotation being the opposite for the left ejector handle) such that the ejector handle finds the front portion free to enter the cutout 23 of the guide plate 13 and by continuing to rotate the swivel handle clockwise, the board 20 is drawn in such that the connector of the board will mate properly with connector of the back panel and is held securely in place by the swivel handles 51, in a manner well understood by those skilled in the art.

Referring to FIG. 5, there is shown a left side view of the card cage assembly 10, which shows the guide plate 13 and its component parts. In particular, the three tracks are shown along with the corresponding cutout 23 and threaded fastener 21 mounted to the mounting plate 22. FIG. 5 shows the relationship of the track 40, the corresponding cutout 23, and the corresponding threaded fastener 21. View A shows the configuration of the cutout 23 of the preferred embodiment of the present invention. The edge material of cutout 23 is formed to fit the inner radius of the ejector handle 51 as known by those skilled in the art. This rolled edge allows the ejector handle to 'roll' around the card cage material edge and not allow it to be caught by the punched material sharp edge. It will be understood by those skilled in the art that the distance between tracks may vary depending on the boards used and the components mounted on the boards and the corresponding cutout 23 and threaded fastener 21 will be positioned relative to the track as indicated in FIG. 5.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

I claim:

1. A card cage assembly (CCA) receiving and securing therein at least a first and a second printed wire board (PWB), said first PWB held in the CCA by a securing mechanism attached to the PWB having a face plate with a fastener device at each end of the face plate, and said second PWB held in the CCA by a securing mechanism attached to the PWB that includes an injector/ejector handle on each side of the PWB, the CCA having a rectangular, box-like configuration comprising:

a) a top plate;

b) a bottom plate;

c) a first side plate and a second side plate arranged on opposite ends of the CCA, and each of the first and the second side plates including a plurality of tracks arranged to form at least first and second slots within the interior of the CCA, each of said first and second slots arranged to permit the insertion of a corresponding PWB therein with each track providing a front-to-back path for an edge of the inserted PWB, each of the first and second side plates further including a mounting plate perpendicular to the surface and along an edge of a respective side plate which forms a periphery of an opening of the CCA, and each mounting plate including a plurality of fastener receivers with a respective fastener receiver corresponding to a respective track of said first and second slots, and each of said first and second side plates further including a plurality of cutouts in the surface of each side plate at the start of each track of said first and second slots, whereby said first PWB is inserted into said first slot and is secured to said CCA by engaging a respective fastener device to a corresponding fastener receiver and said second PWB is inserted into said second slot and is secured to said CCA by engaging a respective injector/ejector handle to a corresponding cutout.

2. The card cage assembly according to claim 1, wherein each of said first and second slots accepts either said first PWB by engaging a respective fastener device to a corresponding fastener receiver or said second PWB by engaging a respective injector/ejector handle to a corresponding cutout.

3. A card cage assembly according to claim 2, further including a backplane.

4. A card cage assembly according to claim 3, where each of said first and second side plates includes open slots between said tracks for providing ventilation.

5. A card cage assembly according to claim 3, wherein said fastener devices are screws and each of said fastener receivers are threaded bores and each threaded bore receives and engages a corresponding fastener screw.

6. A card cage assembly according to claim 5, wherein each of said injector/ejector handles are rotatable mounted to said second PWB and include a front portion, said front portion entering and engaging a corresponding cutout responsive to rotation of said injector/ejector handle.

* * * * *